(12) United States Patent
Maeda et al.

(10) Patent No.: US 6,717,499 B2
(45) Date of Patent: Apr. 6, 2004

(54) TRANSFORMER FOR GAS INSULATED ELECTRIC APPARATUS

(75) Inventors: Yasuhiro Maeda, Tokyo (JP); Hirohide Aoki, Tokyo (JP); Hiroyuki Hama, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/156,150

(22) Filed: May 29, 2002

(65) Prior Publication Data

US 2003/0128089 A1 Jul. 10, 2003

(30) Foreign Application Priority Data

Jan. 7, 2002 (JP) ........................................ 2002-000462

(51) Int. Cl.7 ............................................. H01F 27/08
(52) U.S. Cl. .............................. 336/55; 336/60; 336/61
(58) Field of Search ............................. 336/55, 60, 61; 361/600, 603, 604, 612, 618

(56) References Cited

U.S. PATENT DOCUMENTS 3,943,433 A * 3/1976 Hermstein et al. .......... 323/358

FOREIGN PATENT DOCUMENTS

| JP | 35702041 A | * | 2/1982 | ................. 323/210 |
| JP | 2-115770 | | 4/1990 | |

* cited by examiner

*Primary Examiner*—Anh Mai
(74) *Attorney, Agent, or Firm*—Sughrue Mion, PLLC

(57) ABSTRACT

Disclosed is a transformer for a gas insulated electrical apparatus which requires no grounding field and which provides high accuracy with a simple structure. A transformer includes a capacitor type voltage divider having a floating electrode at a position opposed to a high-voltage conductor through an insulation sealing terminal mounted to a flange of a branch pipe provided on an inner surface of the annular grounding container; an ohm resistor for voltage division which has an impedance that is sufficiently smaller than the impedance between the floating electrode and the annular grounding container; and a converting portion which converts the detection voltage of the high-voltage conductor to a voltage value that allows processing on the secondary side.

6 Claims, 5 Drawing Sheets

TRANSFORMER FOR GAS INSULATED ELECTRIC APPARATUS

This application is based on Application No. 2002-000462, field in Japan on Jan. 7, 2002, the contents of which are hereby incorporated by reference.

BACKGROUND OF THE INVENTION

1. Field of the Invention

This invention relates to a transformer for a gas insulated electric apparatus and, in particular, to a transformer for a gas insulated electric apparatus for a gas insulated switching device used in the power system transformation field.

2. Description of the Related Art

FIG. 5 is a schematic diagram showing a voltage detecting device of a conventional three-phase-batch type gas insulated switching device as disclosed, for example, in Japanese Patent Application Laid-open No. Hei 2-115770.

In FIG. 5, three-phase high-voltage conductors 3a through 3c are arranged in a regular triangle in an annular grounding container 1 filled with an insulation arc-extinguishing gas, such as $SF_6$ gas. Provided between openings of the annular grounding container 1 connected to each other is a disc-like partition mounting plate 17 consisting of a metal material, and bolts (not shown) are inserted into the peripheral portions of the high-voltage conductors 3a through 3c for fastening and fixation.

This partition mounting plate 17 has coaxial through-holes 18a through 18c having a diameter which sufficiently allows insulation if the high-voltage conductors 3a through 3c are inserted, and single-phase spacers 19a through 19c made of insulating materials are respectively mounted to the through-holes 18a through 18c, supporting the high-voltage conductors 3a through 3c.

Further, cylindrical grounding shields 16a through 16c situated coaxially with the through-holes 18a through 18c of the partition mounting plate 17 and mitigating the electric field of the mounting flange portions of the single-phase spacers 19a through 19c are fixed to the partition mounting plate 17 by fastening screws common to the single-phase spacers 19a through 19c.

Further, cylindrical floating electrodes 15a through 15c are provided in the outer periphery of the high-voltage conductors 3a through 3c and inside the grounding shields 16a through 16c so as to be coaxial therewith, the floating electrodes 15a through 15c being secured to the respective grounding shields 16a through 16c through the intermediation of insulators 20.

The respective floating electrodes 15a through 15c are connected to transformer portions 24a through 24c arranged outside the annular grounding container 1 and containing auxiliary capacitors through the intermediation of conductors 23 extending through insulation sealing terminals 21 on the annular grounding container 1 respectively mounted at the closest position and through hole portions 22a through 22c provided in the grounding shields 16a through 16c.

Further, the floating electrodes 15a through 15c are arranged at the centers of the grounding shields 16a through 16c with respect to the axial direction thereof, and the grounding shield length $1_x$ is substantially not less than twice the length $1_z$ of the floating electrodes 15a through 15c.

In the above-described capacitor type voltage divider in the conventional gas insulated switching device, in order to restrain the influence from other phase, the grounding shields 16a through 16c are provided coaxially with the floating electrodes 15a through 15c, so that it is difficult to reduce the inter-phase distance of the high-voltage conductors 3a through 3c, thus making it difficult to achieve a reduction in the size of the three-phase-batch type gas insulated switching device. Further, the provision of the grounding shields 16a through 16c leads to an increase in the cost of the three-phase-batch type gas insulated switching device.

SUMMARY OF THE INVENTION

This invention has been made with a view to solving the above problems in the prior art. It is an object of this invention to provide a high-accuracy transformer for a gas insulated electrical apparatus which needs no grounding field and which has a simple structure.

According to the present invention, there is provided a transformer for a gas insulated electrical apparatus applicable to a gas insulated electrical apparatus in which a high-voltage conductor is arranged in an annular grounding container in which an insulation arc-extinguishing gas is sealed. The transformer comprises a capacitor type voltage divider having a floating electrode at a position opposed to a high-voltage conductor through an insulation sealing terminal mounted to a flange of a branch pipe provided on an inner surface of the annular grounding container. Also comprises an ohm resistor for voltage division which is mounted on an outer peripheral surface of the annular grounding container, one end of which is grounded and the other end of which is connected to the floating electrode through the capacitor type voltage divider, and which has an impedance which is sufficiently smaller than the impedance between the floating electrode and the annular grounding container. Further the transformer a converting portion which is connected in parallel to the ohm resistor for voltage division, which has an input impedance sufficiently larger than the resistance value of the ohm resistor for voltage division, and which converts the detection voltage of the high-voltage conductor to a voltage value that allows processing on the secondary side.

Therefore, it is possible to obtain a stable and highly accurate voltage divider free from the influence of assembly errors, etc., so that it is possible to reduce the inter-phase distance of the high-voltage conductor without adopting a structure in which a grounding shield is provided. Thus, it is possible to achieve a reduction in the size of the gas insulated switching device, and there is no need to provide a grounding shield, thereby achieving a reduction in cost.

DESCRIPTION OF THE PREFERRED EMBODIMENTS

Embodiment 1

Figure 1:
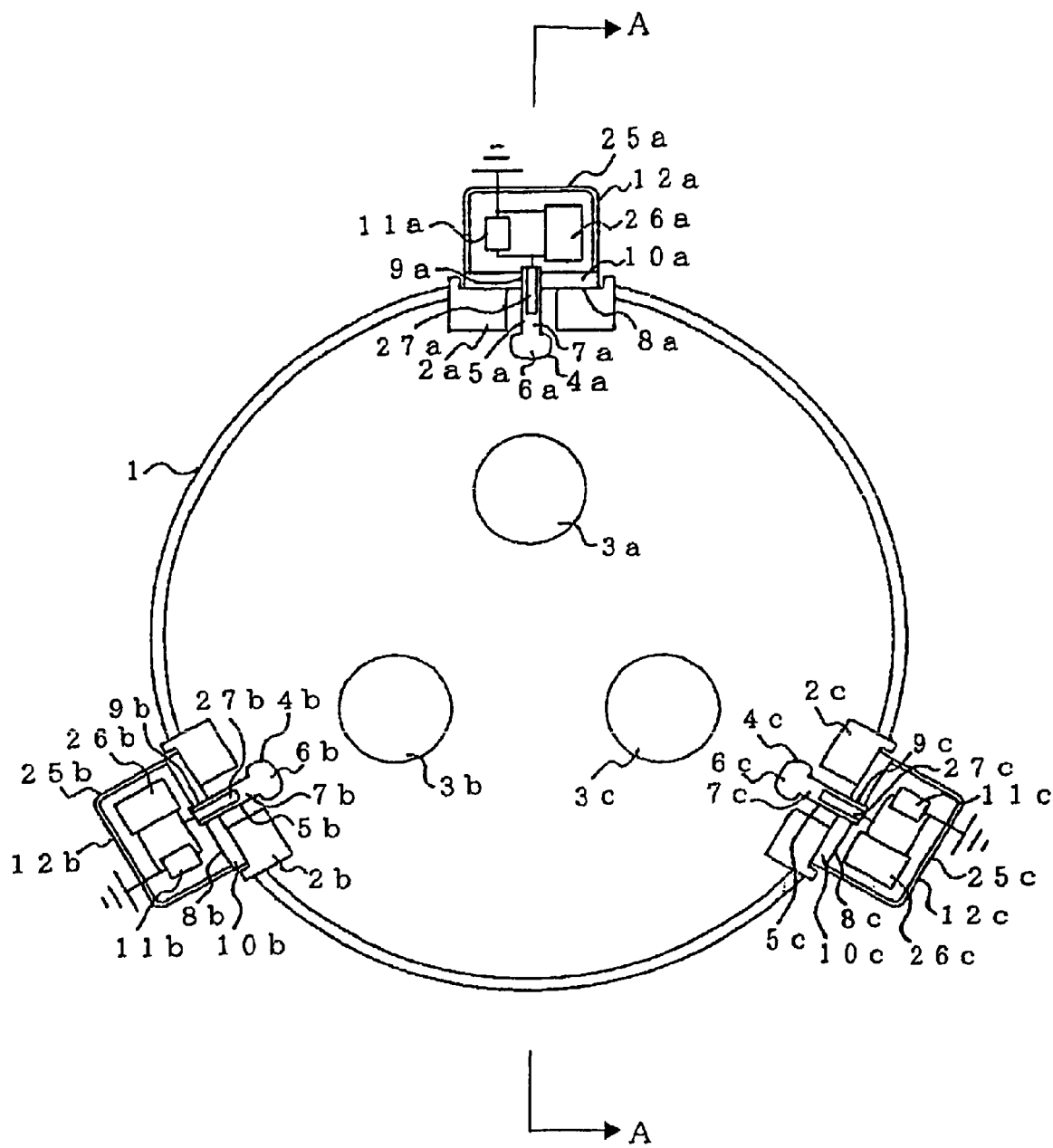
FIG. 1 is a sectional view of a gas insulated electrical apparatus provided with a transformer for a gas insulated electrical apparatus according to Embodiment 1 of the present invention.
Figure 2:
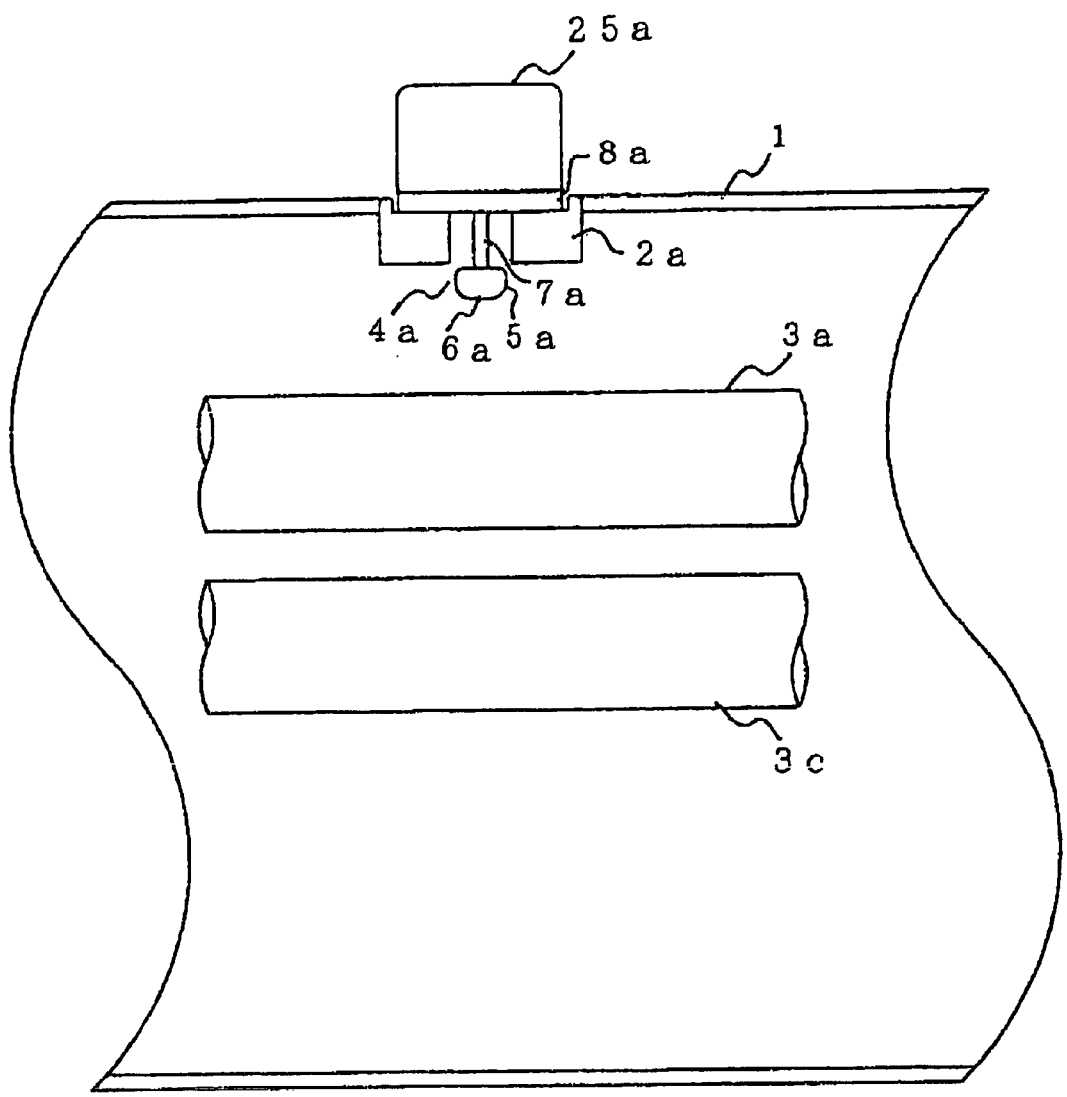
FIG. 2 is a sectional view of the gas insulated electrical apparatus taken along the line A—A of FIG. 1.
Figure 5:
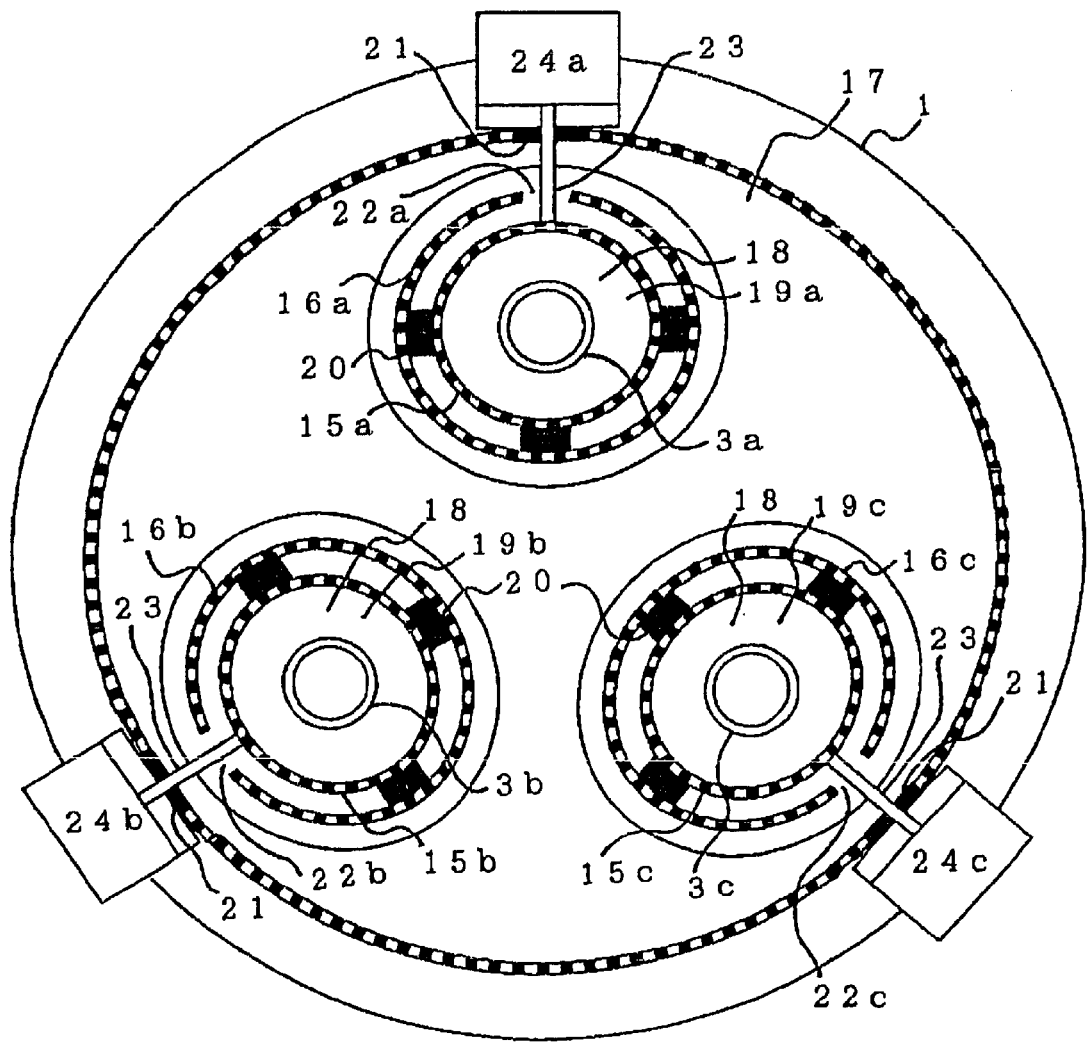
FIG. 5 is a sectional view of a gas insulated electrical apparatus provided with a conventional transformer for a gas insulated electrical apparatus.

FIG. 1 is a sectional view of a gas insulated electrical apparatus provided with a transformer for a gas insulated electrical apparatus according to Embodiment 1 of the present invention; and FIG. 2 is a sectional view taken along the line A—A of FIG. 1. In the drawings, the components which are the same as or equivalent to those of FIG. 5 are indicated by the same reference numerals, and a description of such components will be omitted.

In the drawings, high-voltage conductors $3a$ through $3c$ are accommodated in the annular grounding container 1, which is a pressure container filled with an insulation arc-extinguishing gas, such as $SF_6$ gas. Flange-shaped branch pipes $2a$ through $2c$ are mounted to the annular grounding container 1 so as to be opposed to the high-voltage conductors $3a$ through $3c$, and voltage dividing portions $4a$ through $4c$ are fixed by the flange-shaped branch pipes $2a$ through $2c$.

The voltage dividing portions $4a$ through $4c$ are capacitor type voltage dividers composed of floating electrodes $5a$ through $5c$ consisting of disc-shaped flat antennas $6a$ through $6c$ and support conductors $7a$ through $7c$, central conductors $9a$ through $9c$, and insulation sealing terminals $8a$ through $8c$ consisting of flange-shaped cast insulators $10a$ through $10c$.

The support conductors $7a$ through $7c$ are connected to the flange-shaped cast insulators $10a$ through $10c$ so as to be perpendicular thereto by the central conductors $9a$ through $9c$, and the floating electrodes $5a$ through $5c$ are insulated from the annular grounding container 1.

The annular grounding container 1 is kept hermetic by the flange-shaped branch pipes $2a$ through $2c$ and the flange-shaped cast insulators $10a$ through $10c$.

Further, one ends of ohm resistors for voltage division $11a$ through $11c$ are connected to the central conductors $9a$ through $9c$, and the other ends of the ohm resistors for voltage division $11a$ through $11c$ are connected to grounding cases $12a$ through $12c$ which are at the same potential as the annular grounding container 1.

In the above-described construction, by making the resistance value of the ohm resistors for voltage division $11a$ through $11c$ sufficiently smaller than the impedance between the floating electrodes $5a$ through $5c$ and the annular grounding container 1, the influence of the electrostatic field between the floating electrodes $5a$ through $5c$ and the annular grounding container 1 can be restrained, so that there is no need to provide grounding shields $16a$ through $16c$ between the floating electrodes $5a$ through $5c$ and the annular grounding container 1 as in the prior art, whereby it is possible to obtain a stable and high-accurate voltage divider without being influenced by the assembly errors, etc. due to the provision of the grounding shields.

Further, by making the input impedance of converting portions $26a$ through $26c$ sufficiently large, it is possible to make the resistance value of the ohm resistors for voltage division $11a$ through $11c$ not less than several kΩ, making it possible to reduce the size of the disc-shaped flat antennas $6a$ through $6c$ and the size of the voltage divider.

Further, due to the reduction in the size of the disc-shaped flat antennas $6a$ through $6c$, the influence of the electrostatic field due to the other-phase conductor voltage is diminished, making it possible to obtain a transformer for a gas insulated electrical apparatus equipped with a stable and highly accurate voltage divider.

Further, by providing temperature compensation resistor units $27a$ through $27c$ inside the voltage divider, it is possible to compensate for the temperature characteristic error in the floating capacitance between the high-voltage conductors $3a$ through $3c$ and the floating electrodes $5a$ through $5c$, making it possible to obtain a transformer for a gas insulated electrical apparatus equipped with a more stable and highly accurate voltage divider.

Further, by endowing the converting portions $26a$ through $26c$ with an integration processing function and a function by which they convert electric analog signals into optical digital signals, it is possible to convert the detection voltage of the high-voltage conductors $3a$ through $3c$ to a voltage value that allows processing on the secondary side, making it possible to effect optical digital transmission of the secondary output voltage generated between the ohm resistors for voltage division $11a$ through $11c$ without being influenced by external noises.

Further, by receiving the converting portions $26a$ through $26c$ in transformers $25a$ through $25c$ directly attached to the gas insulated electrical apparatus, it is possible to achieve a reduction in the size of the gas insulated electrical apparatus.

Embodiment 2

Figure 3:
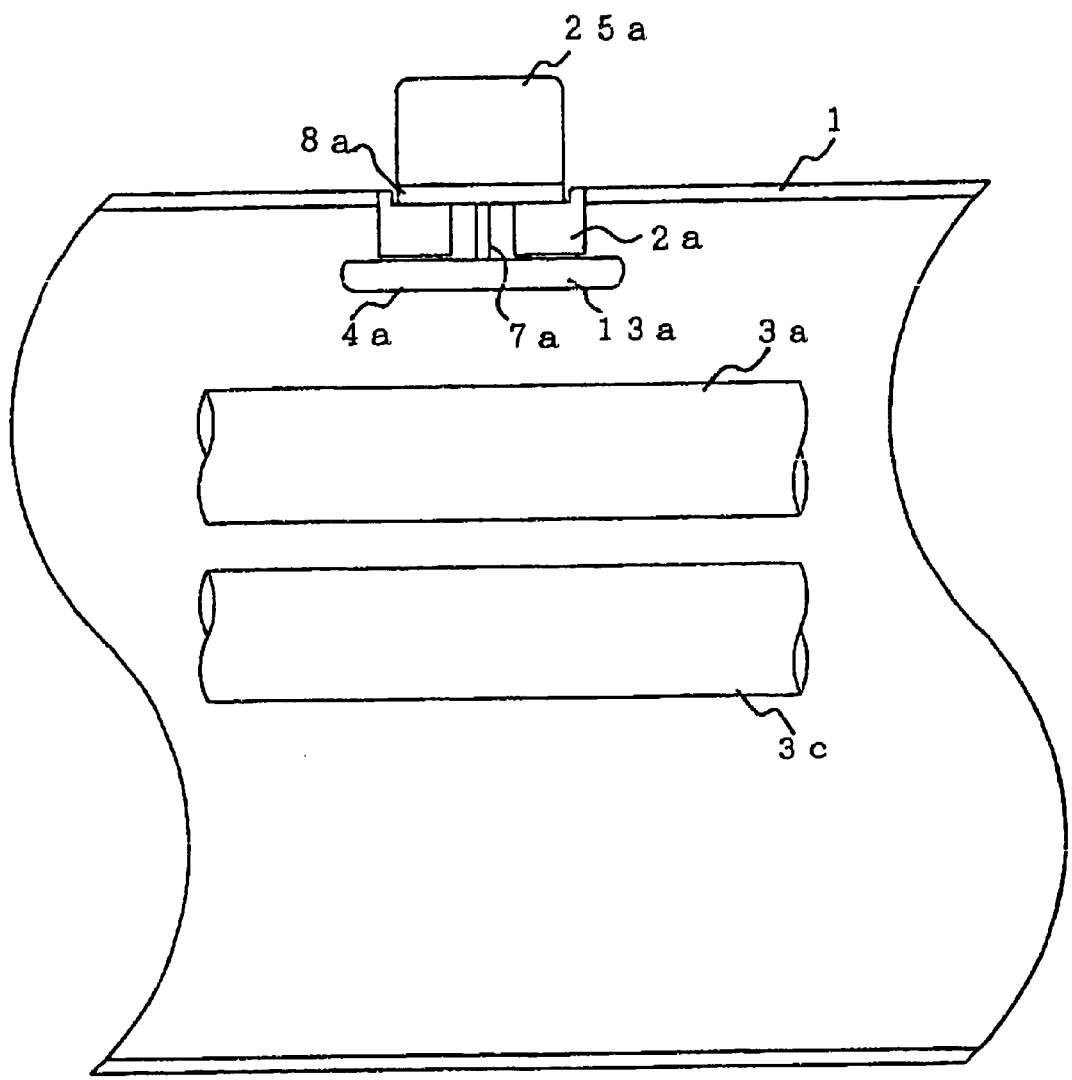
FIG. 3 is a sectional view of a gas insulated electrical apparatus provided with a transformer for a gas insulated electrical apparatus according to Embodiment 2 of the present invention.

FIG. 3 is a sectional view showing a transformer portion of a gas insulated electrical apparatus according to Embodiment 2 of this invention. This embodiment differs from the above-described Embodiment 1 in that the floating electrodes $5a$ through $5c$ are formed by elliptic antennas $13a$ through $13c$ elongated in the axial direction of the high-voltage conductors $3a$ through $3c$.

In Embodiment 2, constructed as described above, the influence of the electrostatic field due to the other-phase conductor voltage is diminished, as in Embodiment 1, making it possible to obtain a transformer for a gas insulated electrical apparatus equipped with a voltage divider which is stable and of high accuracy and in which the secondary output voltage is sufficiently high.

Embodiment 3

Figure 4:
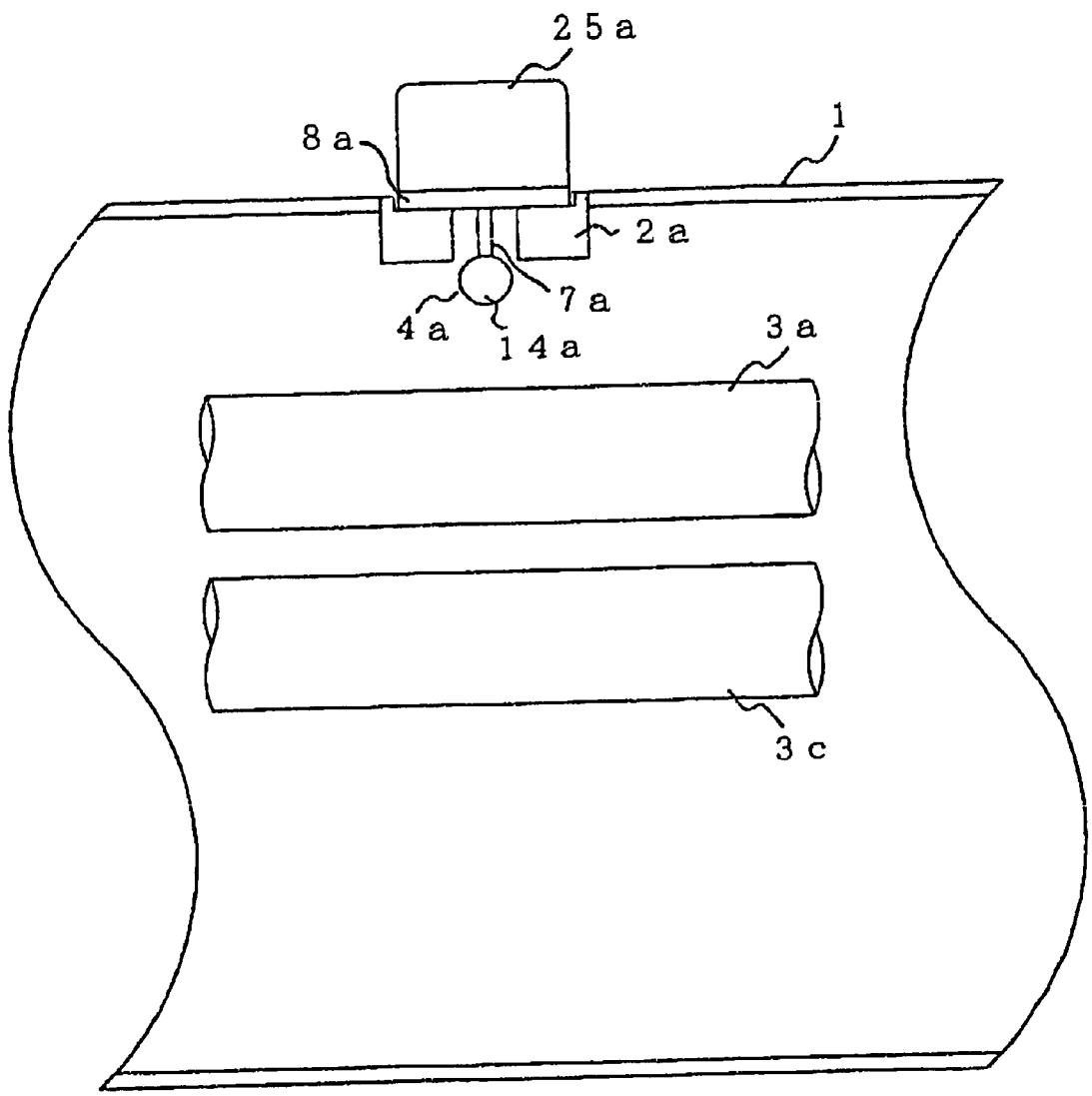
FIG. 4 is a sectional view of a gas insulated electrical apparatus provided with a transformer for a gas insulated electrical apparatus according to Embodiment 3 of the present invention.

FIG. 4 is a sectional view showing a transformer portion of a gas insulated electrical apparatus according to Embodiment 3 of this invention. This embodiment differs from the above-described Embodiments 1 and 2 in that the floating electrodes $5a$ through $5c$ are formed by spherical antennas $14a$ through $14c$.

In Embodiment 3, constructed as described above, the antenna portions exhibit no directivity, and there is no influence of assembly errors, etc., making it possible to obtain a transformer for a gas insulated electrical apparatus equipped with a voltage divider of a still higher accuracy.

According to the present invention, it is possible to obtain a stable and highly accurate voltage divider free from the influence of assembly errors, etc., so that it is possible to reduce the inter-phase distance of the high-voltage conductor without adopting a structure in which a grounding shield is provided. Thus, it is possible to achieve a reduction in the size of the gas insulated switching device, and there is no need to provide a grounding shield, thereby achieving a reduction in cost.

Further, it is possible to diminish the influence of the electrostatic field due to the other-phase high-voltage conductor.

Further, it is possible to diminish the influence of the electrostatic field due to the other-phase high-voltage conductor.

Further, the antenna portion exhibits no directivity, making it possible to diminish the influence of assembly errors, etc.

Further, it is possible to achieve a reduction in the size of the gas insulated electrical apparatus.

Further, it is possible to obtain a transformer for a gas insulated electrical apparatus provided with a stable and highly accurate voltage divider.

What is claimed is:

1. A transformer for a gas insulated electrical apparatus applicable to a gas insulated electrical apparatus in which a high-voltage conductor is arranged in an annular grounding container in which an insulation arc-extinguishing gas is sealed, comprising:

a capacitor type voltage divider having a floating electrode at a position opposed to a high-voltage conductor through an insulation sealing terminal mounted to a flange of a branch pipe provided on an inner surface of the annular grounding container;

an ohm resistor for voltage division which is mounted on an outer peripheral surface of the annular grounding container, one end of which is grounded and the other end of which is connected to the floating electrode through the capacitor type voltage divider, and which has an impedance which is sufficiently smaller than the impedance between the floating electrode and the annular grounding container; and a converting portion which is connected in parallel to the ohm resistor for voltage division, which has an input impedance sufficiently larger than the resistance value of the ohm resistor for voltage division, and which converts the detection voltage of the high-voltage conductor to a voltage value that allows processing on the secondary side.

2. A transformer for a gas insulated electrical apparatus according to claim 1, wherein the floating electrode is formed as a disc having a diameter not larger than the diameter of the opposing high-voltage conductor.

3. A transformer for a gas insulated electrical apparatus according to claim 1, wherein the floating electrode is formed as an elliptic plate having a shorter axis not longer than the diameter of the opposing high-voltage conductor and elongated in the axial direction of the high-voltage conductor.

4. A transformer for a gas insulated electrical apparatus according to claim 1, wherein the floating electrode is formed in a spherical configuration having a diameter not larger than the diameter of the opposing high-voltage conductor.

5. A transformer for a gas insulated electrical apparatus according to claim 1, wherein the converting portion is provided inside the transformer.

6. A transformer for a gas insulated electrical apparatus according to claim 1, further comprising a temperature compensation resistor unit for compensating for the temperature characteristic error in the floating capacitance between the high-voltage conductor and the floating electrode.

* * * * *